United States Patent

Chen et al.

[11] Patent Number: 6,087,882
[45] Date of Patent: Jul. 11, 2000

[54] ULTRA-LOW POWER MAGNETICALLY COUPLED DIGITAL ISOLATOR USING SPIN VALVE RESISTORS

[75] Inventors: Baoxing Chen, Burlington; Geoffrey T. Haigh, Boxford; Alberto G. Comaschi, North Andover, all of Mass.

[73] Assignee: Analog Devices, Inc., Norwood, Mass.

[21] Appl. No.: 09/205,760

[22] Filed: Dec. 4, 1998

[51] Int. Cl.[7] ................................................. H01L 21/56
[52] U.S. Cl. ........................................ 327/333; 327/510
[58] Field of Search .................... 338/32 R; 327/333, 327/510; 323/368, 294

[56] References Cited

U.S. PATENT DOCUMENTS

| | | | |
|---|---|---|---|
| 5,270,645 | 12/1993 | Wheeler et al. | 324/207.12 |
| 5,650,357 | 7/1997 | Dobkin et al. | 437/207 |
| 5,719,494 | 2/1998 | Dettmann et al. | 324/117 |
| 5,831,426 | 11/1998 | Black, Jr. et al. | 324/127 |

OTHER PUBLICATIONS

Analog Devices, AD260 High Speed, Logic Isolator with Power Transformer, p. 1, 1998.

*Primary Examiner*—Timothy P. Callahan
*Assistant Examiner*—Linh Nguyen
*Attorney, Agent, or Firm*—Samuels, Gauthier & Stevens, LLP

[57] ABSTRACT

An isolator having a driver circuit which is responsive to an input signal to drive signals into a magnetic-field generator such as at least one coil. The generator is magnetically coupled to a sensor that includes spin-valve resistors which have resistance characteristics that are variable in response to the magnetic field generated by the generator. A receiver circuit incorporating a strobe generator converts the resistance changes to an output signal corresponding to the input signal.

10 Claims, 6 Drawing Sheets

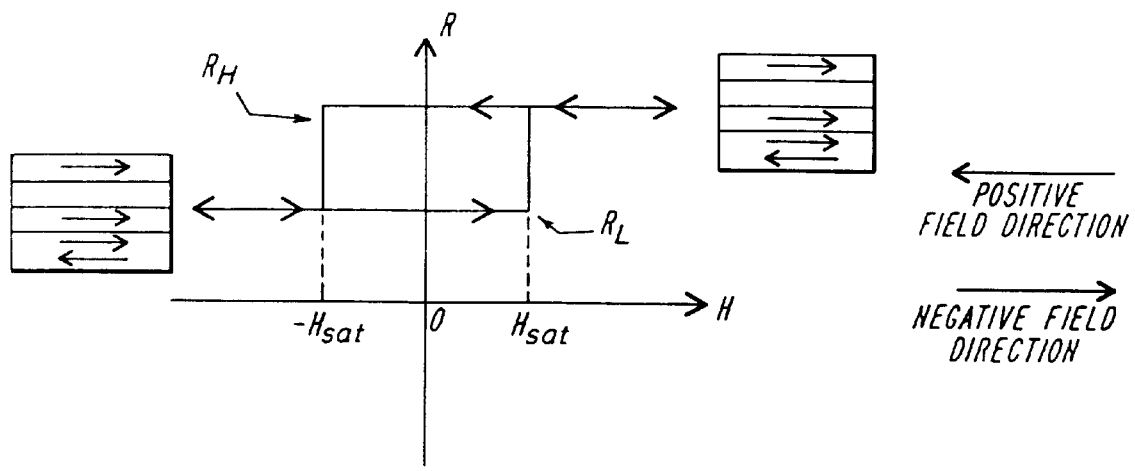
FIG. 3
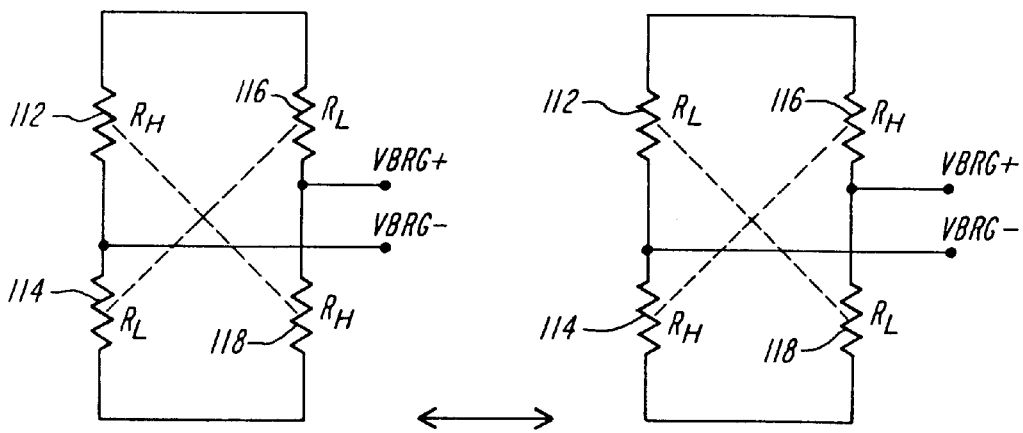
FIG. 4A  FIG. 4B

6,087,882

ULTRA-LOW POWER MAGNETICALLY COUPLED DIGITAL ISOLATOR USING SPIN VALVE RESISTORS

BACKGROUND OF THE INVENTION

The invention relates to the field of circuitry for isolating digital electronic signals. Such circuits are used to provide galvanic isolation between digital signal sources in a process control system and micro-controllers receiving signals from these sources, or between micro-controllers and other digital signal sources and transducers or other devices using those signals.

In many industrial applications, such as process control systems or data acquisition and control systems, digital signals need to be transmitted between sources and user interfaces to use these signals. To maintain safety voltage levels at the user interface and prevent transient signals to be transmitted from the sources, electrical isolation is mandatory. There are three commonly known isolation methods: opto-couplers, capacitively coupled isolators, and transformer based isolators.

Opto-couplers have limitations in their lifetime, speed and power dissipation, while both capacitively coupled isolators and transformer-based isolators are essentially AC coupled, and have limitations in their size and the ability to reject common mode voltage transients. All of the three types of isolators suffer from their difficulties in IC integration, and sometimes they even require hybrid packaging.

Recently, a new isolation technique based on giant magneto-resistive (GMR) resistors has been proposed. These GMR resistors are typically magnetic multilayers that consist of thin magnetic layers separated by thin non-magnetic layers. Circuits made with this GMR based isolation technique allow multiple high voltage isolated inputs to be economically integrated with conventional VLSI circuitry. There also exist methods of using a Faraday shield to improve the ability to reject the common voltage transients in these magnetically coupled isolators.

Among various GMR structures, there is one type of structure that consists of a sandwich of a couple of ferromagnetic (FM) layers separated by a non-magnetic layer on the top of an anti-ferromagnetic (AFM) layer. The AFM layer pins the spin orientation of the neighboring FM layer and the spin direction of the other FM layer is relatively free to be switched by an applied magnetic field. When the two FM layers are ferromagnetically coupled, i.e., the magnetizations in the two FM layers are parallel, the structure is at a state of lower resistance.

On the other hand, when the two magnetic layers are anti-ferromagnetically coupled, i.e., the magnetizations in the two FM layers are anti-parallel. The structure is at a state of higher resistance. This type of structure can be switched between two magnetic states acting like a valve, and is conventionally referred to as a spin valve. Due to the spin valves' unique magnetic transport properties, it is possible to utilize them to make digital isolators that dissipate much less power compared to one based on other GMR resistors, let alone compared to one based on the three conventional types of isolation methods.

SUMMARY OF THE INVENTION

The invention is a monolithic digital isolator consists of a driver circuit, on-chip coils, on-chip spin-valve sensing elements and a receiver circuit. Either one die or two may be used. With two dies, the driver circuitry may, for example, be formed on a first substrate and the coils, spin-valve sensing elements and receiver may be formed on a second substrate.

Magneto-resistive coupled digital isolators have advantages of smaller size, higher speed, and lower power over commonly known digital opto-couplers and capacitively coupled digital isolator. The invention includes novel driver/receiver circuits for a digital isolator using GMR spin valves as MR sensing elements. It retains all the advantages of other MR based digital isolator but dissipates much less power, especially for isolation of digital signals around 5 MHz or less.

Accordingly, the invention provides an isolator having a driver circuit that is responsive to an input signal to drive signals into a magnetic-field generator such as at least one coil. The generator is magnetically coupled to a sensor that includes spin-valve resistors which have resistance characteristics that are variable in response to the magnetic field generated by the generator. A receiver circuit converts the resistance changes to an output signal corresponding to the input signal.

BRIEF DESCRIPTION OF THE DRAWINGS

FIG. 3 illustrates a typical resistive transfer curve for spin valves;

FIG. 4 shows two possible resistive configurations for a spin valve bridge;

DETAILED DESCRIPTION OF THE INVENTION

Figure 1:
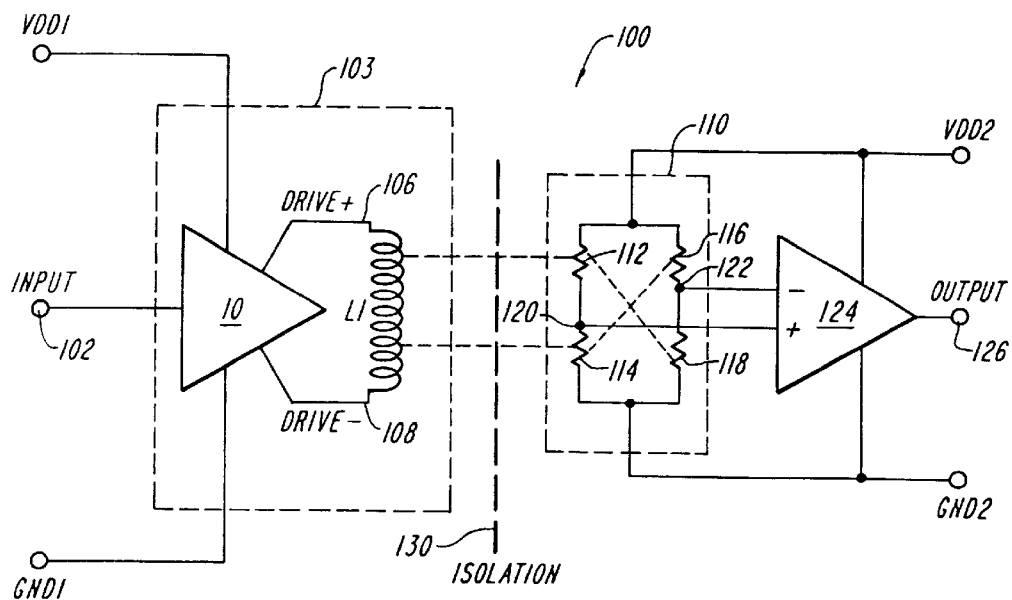
FIG. 1 is a schematic circuit diagram for an exemplary implementation of a digital isolator according to the invention.

FIG. 1 is a schematic circuit diagram of an exemplary implementation of a MR isolator 100 in accordance with the invention. A digital input voltage is supplied at port 102 to a magnetic field generator 103, comprising an input driver 104 and a coil L1. Driver 104 supplies output signals DRIVE+ and DRIVE− on lines 106 and 108, respectively, to the two terminals of the coil L1. A coil L1 generates a magnetic field that is sensed by a bridge 110 of spin valve elements 112, 114, 116, and 118. Elements 112 and 114 are connected in series across the supply rails, as are elements 116 and 118. The bridge provides a differential output across nodes 120 and 122 at the respective junctions between elements 112 and 114 on one hand and elements 116 and 118 on the other. Nodes 120 and 122 supply two signals to the inputs of a differential receiver 124. The output of the isolator appears at port 126.

Galvanic isolation may be desired, thus the input can be referenced to a first ground GND1, and the output is referenced to a second ground GND2. A conventional Faraday shield, 130 can be interposed between the coil L1 and the bridge 110. The Faraday shield provides electrostatic isolation between the coil and the bridge, while allowing the magnetic fields generated by the coil to pass through the elements of the bridge.

Figure 2A:
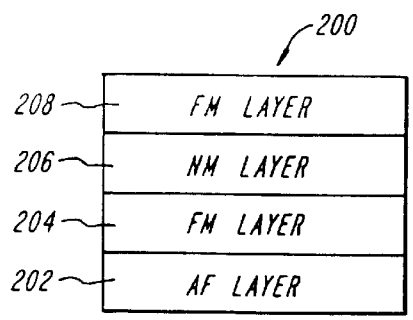
FIGS. 2A and 2B are cross-section diagrams of a typical spin valve structure, and the corresponding spin configurations, respectively.
Figure 2B:
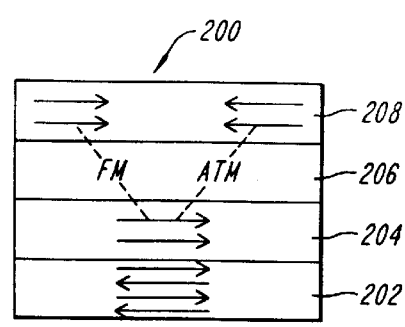

Spin valve elements 112, 114, 116 and 118 are semiconductor structures that are grown on the top of the interconnection layers of receiver circuitry, and have an exemplary cross-section diagram as shown in FIG. 2A. The spin valve structure 200 has an AFM layer 202 that pins the spin direction of the FM layer 204 through exchange bias. Layer 206 is a nonmagnetic (NM) conductor layer which separates FM layer 208 from layer 204. The spin direction of layer 208 can be set by a magnetic field, either parallel or anti-parallel to the spin direction of the layer 204 as shown in FIG. 2B.

If the two ferromagnetic layers are ferromagnetically coupled, i.e., their spin directions are parallel, the elements have a resistance of $R_L$. On the other hand, if the two ferromagnetic layers 204 and 208 are anti-ferromagnetically coupled, i.e., their spin directions are antiparallel the elements have a resistance of $R_H$. Here $R_H$ is larger than $R_L$. A complete resistance transfer curve for spin valve is shown in the graph of FIG. 3. It will be appreciated that the curve has a rather hysterestic nature and has a characteristic switching field or saturation field $H_{sat}$.

If the element is at the FM or low resistance state, then it won't switch to AF or high resistance state until the applied field is larger than $H_{sat}$. On the other hand, if the element is at AF or high resistance state, it won't switch to FM or low resistance state until the field applied at negative direction is larger than $H_{sat}$. By proper placement of the four elements, the bridge 110 can be switched in between two states that are shown in FIGS. 4A and 4B. For a bias voltage $V_{bias}$ across the bridge, the bridge output, VBRG+−VBRG−, changes from $(R_H-R_L)*V_{bias}/(R_H+R_L)$ to $(R_L-R_H)*V_{bias}/(R_H+R_L)$, and this differential signal feeds into the two inputs of differential receiver 124.

Figure 5:
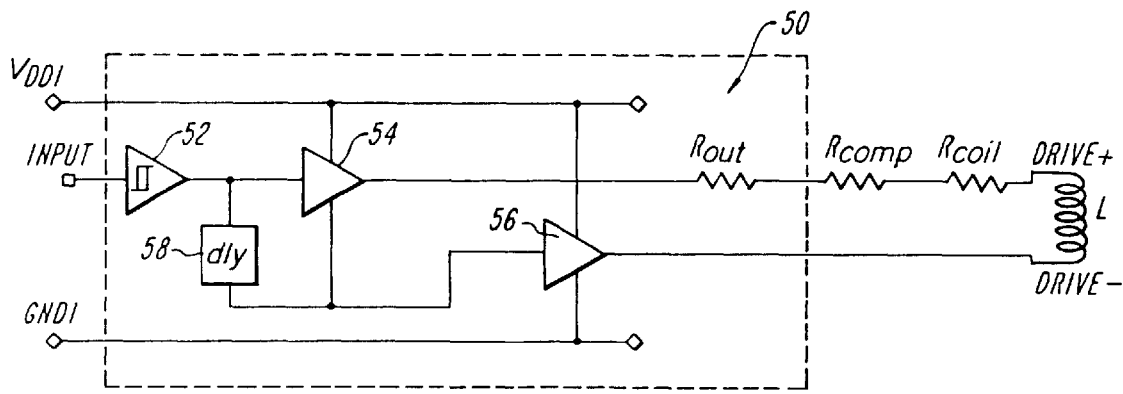
FIG. 5 is a schematic diagram of a drive circuit.

A schematic diagram of an exemplary driver circuit 50 is shown in FIG. 5, which consists of a Schmit trigger 52, a delay element 58, and two identical output buffers 54 and 56.

Figure 6:
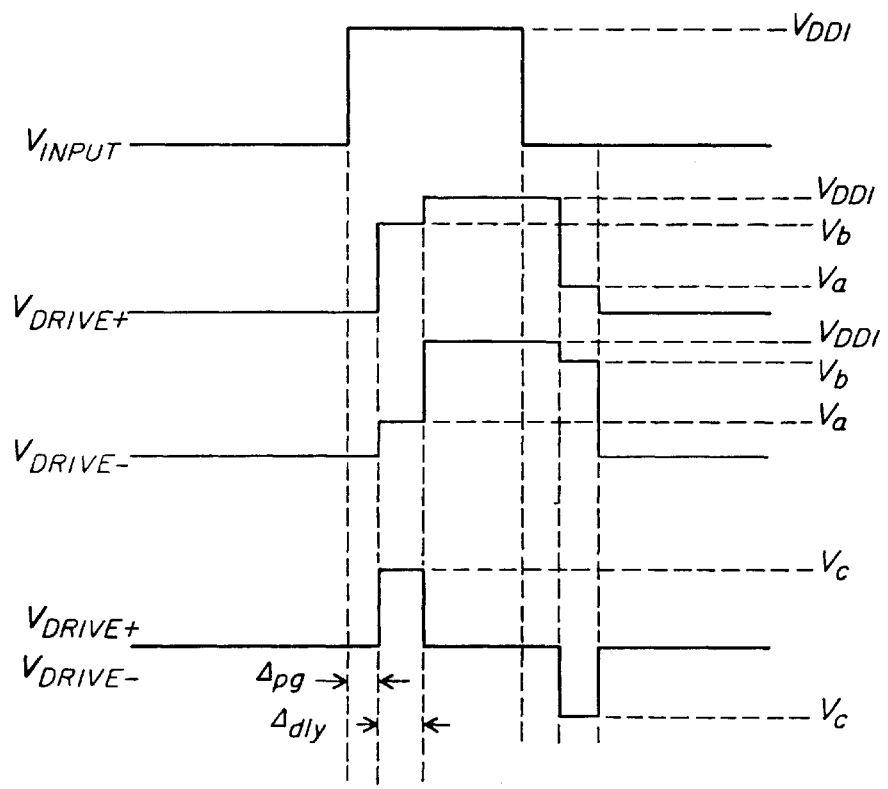
FIG. 6 is a waveform diagram illustrating operation of the driver circuit.

The two output buffers supply two terminals DRIVE+ and DRIVE− of coil L1. A temperature compensation resistor 59 with a resistance of Rcomp in series with the coil L1 is used to optimize the power dissipation at all temperatures. The operation of circuit 50 of FIG. 5 is now described with reference to the waveforms of FIG. 6. Assuming that at time $t_0$, the input goes high, then at time $t_0+\Delta_{pg}$, output buffer 54 pulls high and the output buffer does not pull high until time $t_0+\Delta_{pg}+\Delta_{dly}$. Here $\Delta_{pg}$ is the sum of the propagation delays of the Schmit trigger and the output buffer, and $\Delta_{dly}$ is the delay created by delay element 58. If the pull up resistance of the two output buffers is $R_{up}$, the pull down resistance is $R_{down}$, and the coil effective resistance is $R_{coil}$, then $Va=R_{down}*VDD1/(R_{out}+R_{coil}+R_{comp})$ $Vb=(R_{down}+R_{coil})*VDD1/(R_{out}+R_{coil}+R_{comp})$ $Vc=R_{coil}*VDD1/(R_{out}+R_{coil}+R_{comp})$ Here $R_{out}$ is the sum of $R_{up}$ and $R_{down}$ and is shown in FIG. 5 together with $R_{comp}$ and $R_{coil}$ for purposes of illustration.

Figure 7:
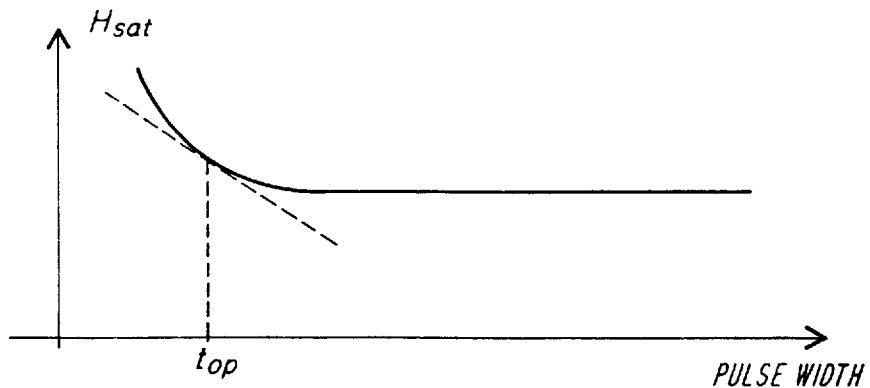
FIG. 7 is a graph illustrating the dependence of spin valve switching field on pulse width.

The pulse current through the coil Icoil will be $Vc/R_{coil}$, i.e., $VDD1/(R_{out}+R_{coil}+R_{comp})$ To optimize power dissipation, Icoil*$\Delta_{dly}$ needs to be minimized. Usually for low frequency or long pulse widths, the switching field does not change that much, but for short pulse widths (~10 ns domain), the shorter the pulse, the higher the switching field. FIG. 7 shows a typical pulse width dependence of the switching field. As the field to be generated by the coil is proportional to Icoil, the optimal pulse width $t_{op}$ can be determined as shown in FIG. 7, where the dashed line has a slope of −1. For current technology, $t_{op}$ can range from 1 ns to 3 ns.

To optimize the power at all operating temperatures, various temperature dependencies need to be taken into consideration. For a fixed pulse width, the spin valve switching field decreases as temperature increases, as is shown in curve (a) of FIG. 8. For a delay element, $\Delta_{dly}$ usually increases with temperature, so the switching field decreases sharper than curve (a).

Figure 8:
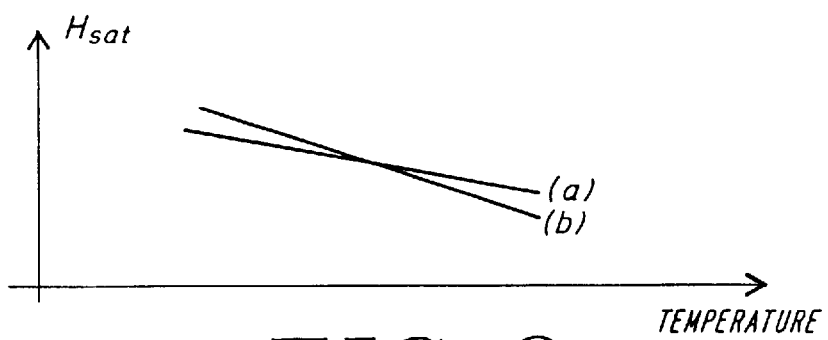
FIG. 8 is a graph illustrating the temperature dependence of the switching field for (a) fixed pulse width and (b) a specific delay element.
Figure 9:
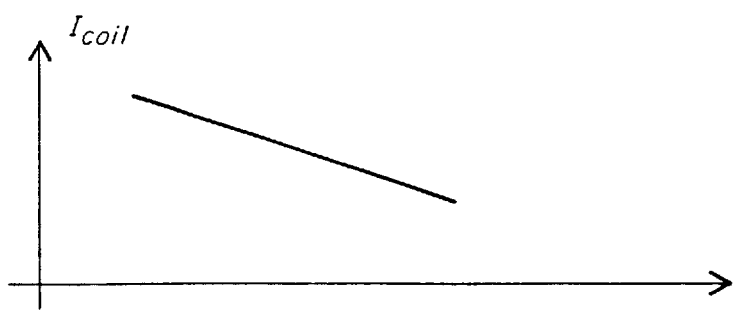
FIG. 9 is a graph illustrating the temperature dependence of coil current for a temperature compensated driver.

The temperature dependence is shown in curve (b) of FIG. 8. As $I_{coil}$ is inversely proportional to $R_{out}+R_{coil}+R_{comp}$, the right value of $R_{comp}$ needs to be chosen with the right temperature coefficient so that the temperature dependence of $I_{coil}$ as shown in curve (c) of FIG. 9 is the same as that of switching field, i.e., the curve (b) of FIG. 8. In this way, the power dissipation is optimized at all operating temperatures.

Figure 10:
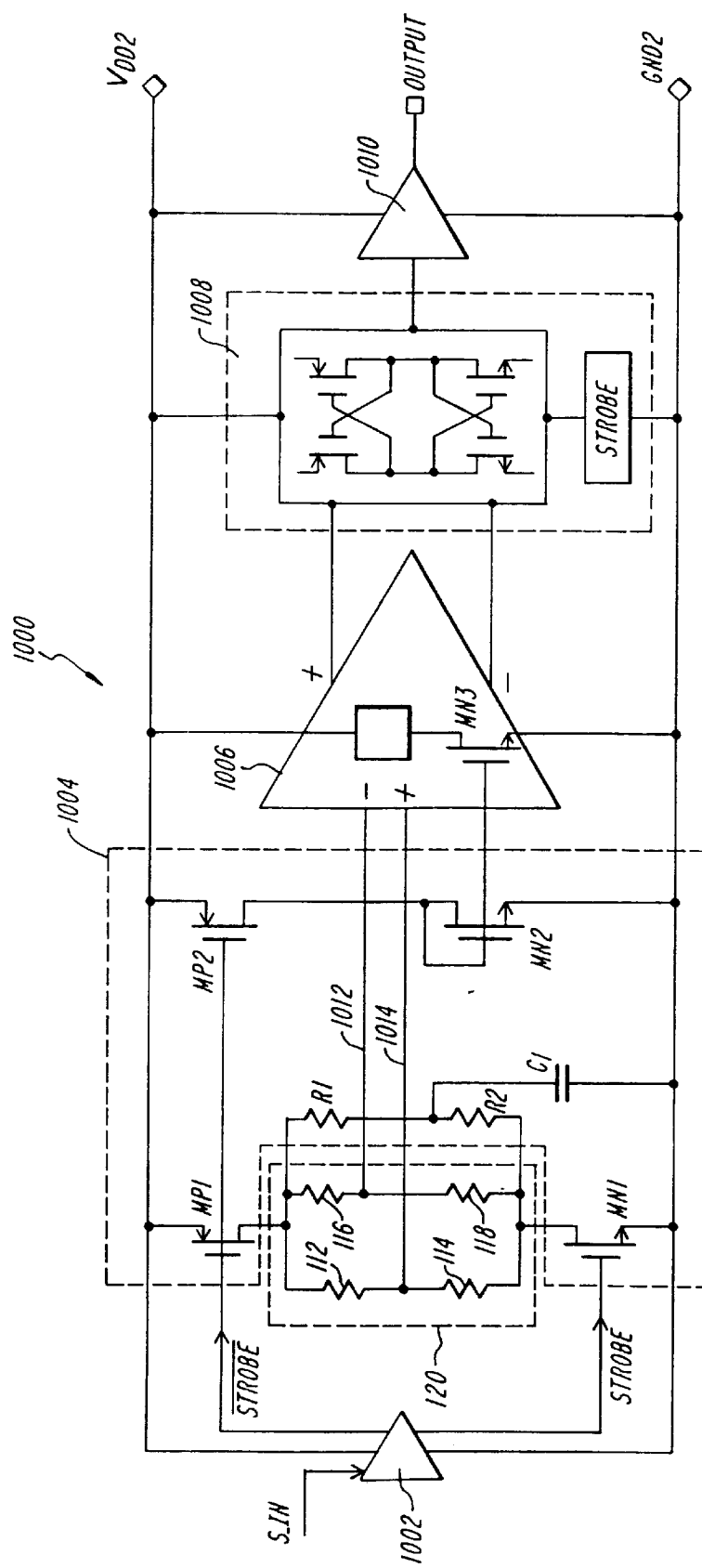
FIG. 10 is a schematic diagram of a receiver circuit.

A schematic diagram of an exemplary receiver circuit 1000 is shown in FIG. 10. The circuit 1000 includes an enabled strobe generator 1002, an input circuit 1004, a differential pre-amplifier 1006, a strobed dynamic latch 1008 and an output buffer 1010. R1, R2 and C1 in input circuit 1004 are used to hold the common mode voltages for differential lines 1012 and 1014 and the settling time upon the strobe changing from low to high is improved tremendously. The supply current for bridge 120 is provided by current source MP1, MN1 and is controlled by a strobe signal. The supply current for pre-amplifier 1006 is provided by current mirror MN2, MN3 and is also controlled by the strobe through MP2. The current supply to both bridge 120 and the pre-amplifier is not on until the strobe changes to high.

Figure 11:
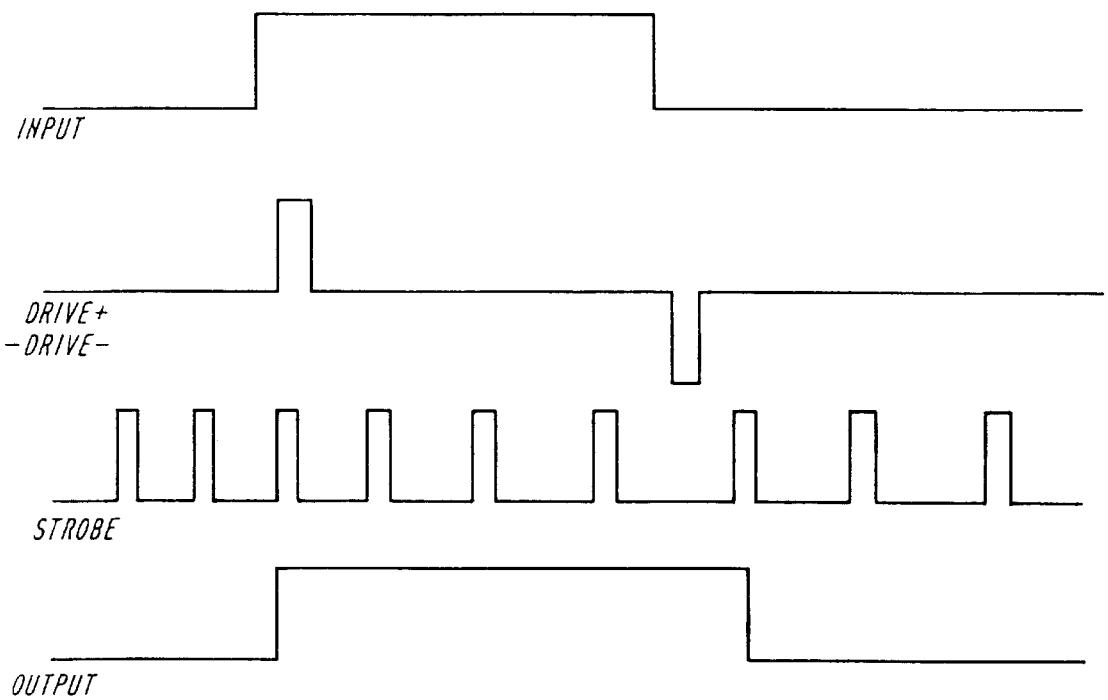
FIG. 11 is a waveform diagram illustrating operation of the receiver circuit.

The operation of the receiver can be understood with reference to the waveform diagrams of FIG. 11. With strobe low, the output remains in the old state, and upon high, the supply current to bridge 120 is on and the current magnetic state is detected as shown in FIGS. 4A and 4B, and the corresponding output voltage level is produced. This type of strobe works because of the memory function of the spin valves. The spin valves remember or retain their magnetic states until a pulse magnetic field of anti-polarity is used to reset the states. For other MR elements, this kind of strobe would not be possible.

For example, consider a 10 MHz strobe with 5 ns pulse width, the quiescent power for the bridge and the pre-amplifier biasing is reduced by 100/5=20 times. With a strobe enable pin S_EN shown in FIG. 10, the strobe can be disabled and the receiver can run at its maximum bandwidth. In this way, the user has the luxury to choose the desired modes, either maximum speed with decent power or medium speed (~1 MHz) with ultra low power.

Figure 12:
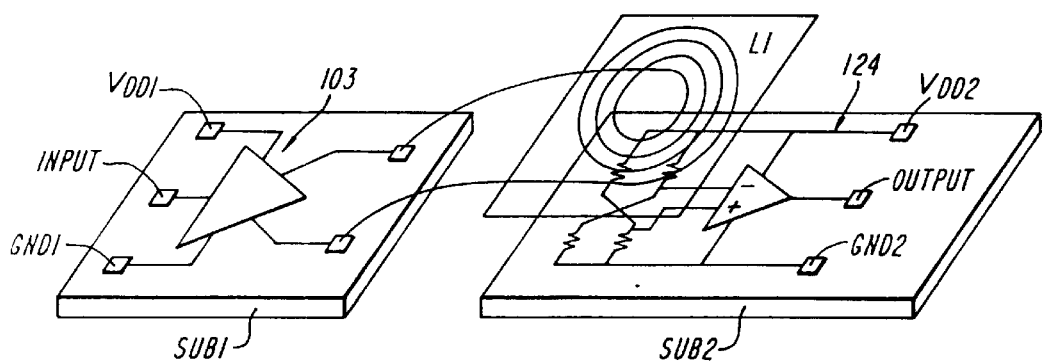
FIG. 12 is perspective schematic circuit diagram of an exemplary isolator implementation according to the invention.

The spatial placement of these components can be seen in FIG. 12, which shows a perspective schematic circuit diagram of an exemplary isolator implementation according to the invention. FIG. 12 is useful to illustrate conceptually how such an isolator may be fabricated monolithically. This is an example of a two die implementation. The driver circuit 103 may be fabricated on a first substrate SUB1. Coil L1 can be fabricated on a second substrate SUB2, and configured on top of the spin valve bridge 120 and receiver circuitry 124. Two bonding wires are used to connect the driver output pads to the coil L1. A single die implementation is also possible with a conventional trenched isolation process.

Although the present invention has been shown and described with respect to several preferred embodiments thereof, various changes, omissions and additions to the form and detail thereof, may be made therein, without departing from the spirit and scope of the invention. For example, it will be appreciated that although the sensor is shown as a bridge circuit in the illustrated embodiments, a single GMR spin-valve element or two spin-valve elements may be employed instead, and four elements can be arranged in a manner other than as a bridge. Likewise, though a single coil is shown as generating the magnetic field, a plurality of coils can be implemented with the appropriate driver circuitry. In addition, the driver circuit is not needed in all cases, as the input signal source may be able to drive the coils directly. Alternatively, some other magnetic-field generating apparatus may be employed.

What is claimed is:

1. A signal isolator comprising:

an input node for receiving an input signal;

at least one magnetic-field generator for generating a magnetic field corresponding to the input signal;

a magnetoresistive sensor operable for receiving the generated magnetic field and supplying a signal at an output node that corresponds to the magnetic field, said sensor including at least one spin-valve resistor; and a receiver circuit including a strobe generator to generate strobes to control the supply current to said at least one spin-valve resistor.

2. The isolator of claim 1, wherein the magnetic-field generator comprises at least one coil that generates said magnetic field.

3. The isolator of claim 2, wherein the magnetic-field generator comprises a driver circuit coupled between the input node and the at least one coil for driving the at least one coil.

4. The isolator of claim 3, wherein the input signal is a digital signal, and the driver circuit drives said at least one coil with dual polarity short pulses of current in response to logic value changes in the input signal.

5. The isolator of claim 4, wherein a temperature compensation resistor is provided between said driver circuit and said at least one coil.

6. The isolator of claim 1, wherein said sensor comprises a bridge configuration of spin-valve resistors.

7. The isolator of claim 1, wherein said receiver circuit comprises a differential pre-amplifier and a strobed dynamic latch.

8. The isolator of claim 1 further comprising a Faraday shield which is disposed between the at least one magnetic-field generator and the sensor.

9. The isolator of claim 1, wherein a Faraday shield is disposed between the at least one magnetic-field generator and the sensor.

10. The isolator of claim 1 further comprising a receiver circuit coupled to said sensor for supplying an output signal at an output thereof.

* * * * *